(12) United States Patent
Ogihara

(10) Patent No.: US 11,005,421 B2
(45) Date of Patent: May 11, 2021

(54) CIRCUIT DEVICE, OSCILLATOR, ELECTRONIC APPARATUS, AND VEHICLE

(71) Applicant: SEIKO EPSON CORPORATION, Tokyo (JP)

(72) Inventor: Tsutomu Ogihara, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/561,661

(22) Filed: Sep. 5, 2019

(65) Prior Publication Data

US 2020/0083843 A1 Mar. 12, 2020

(30) Foreign Application Priority Data

Sep. 6, 2018 (JP) .............................. JP2018-166528

(51) Int. Cl.
*H03B 25/00* (2006.01)
*H03B 5/32* (2006.01)
*H03F 3/45* (2006.01)
*H03B 5/12* (2006.01)

(52) U.S. Cl.
CPC ................. *H03B 5/32* (2013.01); *H03B 5/12* (2013.01); *H03F 3/45071* (2013.01)

(58) Field of Classification Search
CPC ... H03B 5/32; H03B 5/12; H03B 5/00; H03B 5/36; H03F 3/45071
USPC .......................... 331/60, 117 R, 117 FE, 167
See application file for complete search history.

(56) References Cited

U.S. PATENT DOCUMENTS

| 6,768,362 | B1* | 7/2004 | Mann | H03L 7/087 327/147 |
| 7,123,113 | B1* | 10/2006 | Brennan | H03L 5/00 331/158 |
| 7,696,834 | B2* | 4/2010 | Sung | H03L 5/00 331/109 |
| 2004/0251978 | A1* | 12/2004 | Muramatsu | H03B 5/1228 331/117 R |
| 2008/0252390 | A1* | 10/2008 | Guerreiro | H03B 5/32 331/116 FE |
| 2015/0084704 | A1* | 3/2015 | In | H03K 3/0322 331/52 |
| 2015/0214961 | A1* | 7/2015 | Toriumi | H03L 7/1976 331/158 |
| 2016/0190985 | A1* | 6/2016 | Lin | H03B 5/1243 331/117 FE |

(Continued)

FOREIGN PATENT DOCUMENTS

JP H10-004318 A 1/1998
JP 2009-065235 A 3/2009

*Primary Examiner* — Richard Tan
(74) *Attorney, Agent, or Firm* — Oliff PLC

(57) ABSTRACT

A circuit device includes first and second output signal lines, an oscillation circuit that generates differential oscillation signals which are constituted by first and second signals, outputs the first signal to the first output signal line, and outputs the second signal to the second output signal line, a monitor circuit that includes a first input unit including a first input capacitor of which a one end is coupled to the first output signal line and an output unit which is coupled to the first input unit and outputs a monitor result, and a capacitance compensation circuit that includes a second input unit including a second input capacitor of which a one end is coupled to the second output signal line.

10 Claims, 10 Drawing Sheets

(56) References Cited

U.S. PATENT DOCUMENTS

2017/0123528 A1* 5/2017 Hu .................... G06F 3/0412

* cited by examiner

CIRCUIT DEVICE, OSCILLATOR, ELECTRONIC APPARATUS, AND VEHICLE

The present application is based on, and claims priority from JP Application Serial Number 2018-166528, filed Sep. 6, 2018, the disclosure of which is hereby incorporated by reference herein in its entirety.

BACKGROUND

1. Technical Field

The present disclosure relates to a circuit device, an oscillator, an electronic apparatus, and a vehicle.

2. Related Art

Differential signal transmission has been known as signal transmission with high noise resistance and high stability at a high speed. In the differential signal transmission, signal transmission is performed by using first and second signals constituting differential signals. For example, JP-A-2009-65235 discloses a disconnection detection circuit that inputs DP and DM signals of USB which are the differential signals to a plurality of differential amplifiers, and performs disconnection detection of the USB. In the disconnection detection circuit, the disconnection detection of the USB is realized by differentially amplifying voltages of the differential signals and voltages of the inverted signals, respectively and comparing the differentially amplified values of the voltages of the differential signals and the differentially amplified values of the voltages of the inverted signals with an output voltage of a DA converter. In JP-A-2009-65235, the disconnection detection circuit in which an operation is not unstable even though a process or an ambient temperature varies can be realized.

JP-A-2009-65235 does not disclose a circuit that monitors a signal state of an oscillation signal in an oscillation circuit that generates a differential oscillation signal. In order to simplify the circuit at the time of monitoring the signal state of the differential oscillation signal, a method of providing a monitor circuit for only an output signal line of one signal of the differential oscillation signals is considered. However, in this method, a capacitance may be added to the output signal line to which the monitor circuit is coupled, and thus, there is a concern that a balance between the differential oscillation signals will deteriorate.

SUMMARY

An advantage of some aspects of the present disclosure is to solve at least a part of the problems described above, and the present disclosure can be implemented as the following aspects or embodiments.

An aspect of the present disclosure relates to a circuit device including a first output signal line, a second output signal line, an oscillation circuit that generates differential oscillation signals which are constituted by a first signal and a second signal, outputs the first signal to the first output signal line, and outputs the second signal to the second output signal line, a monitor circuit that includes a first input unit including a first input capacitor of which a one end is coupled to the first output signal line and an output unit which is coupled to the first input unit and outputs a monitor result, and a capacitance compensation circuit that includes a second input unit including a second input capacitor of which a one end is coupled to the second output signal line.

DESCRIPTION OF EXEMPLARY EMBODIMENTS

Hereinafter, a preferred embodiment of the present disclosure will be described in detail. The present embodiment to be described below does not wrongfully limit the contents of the present disclosure described in the appended Claims, and all configurations described in the present embodiment are not essential as means for solving in the present disclosure.

1. Configuration of Circuit Device

Figure 1:
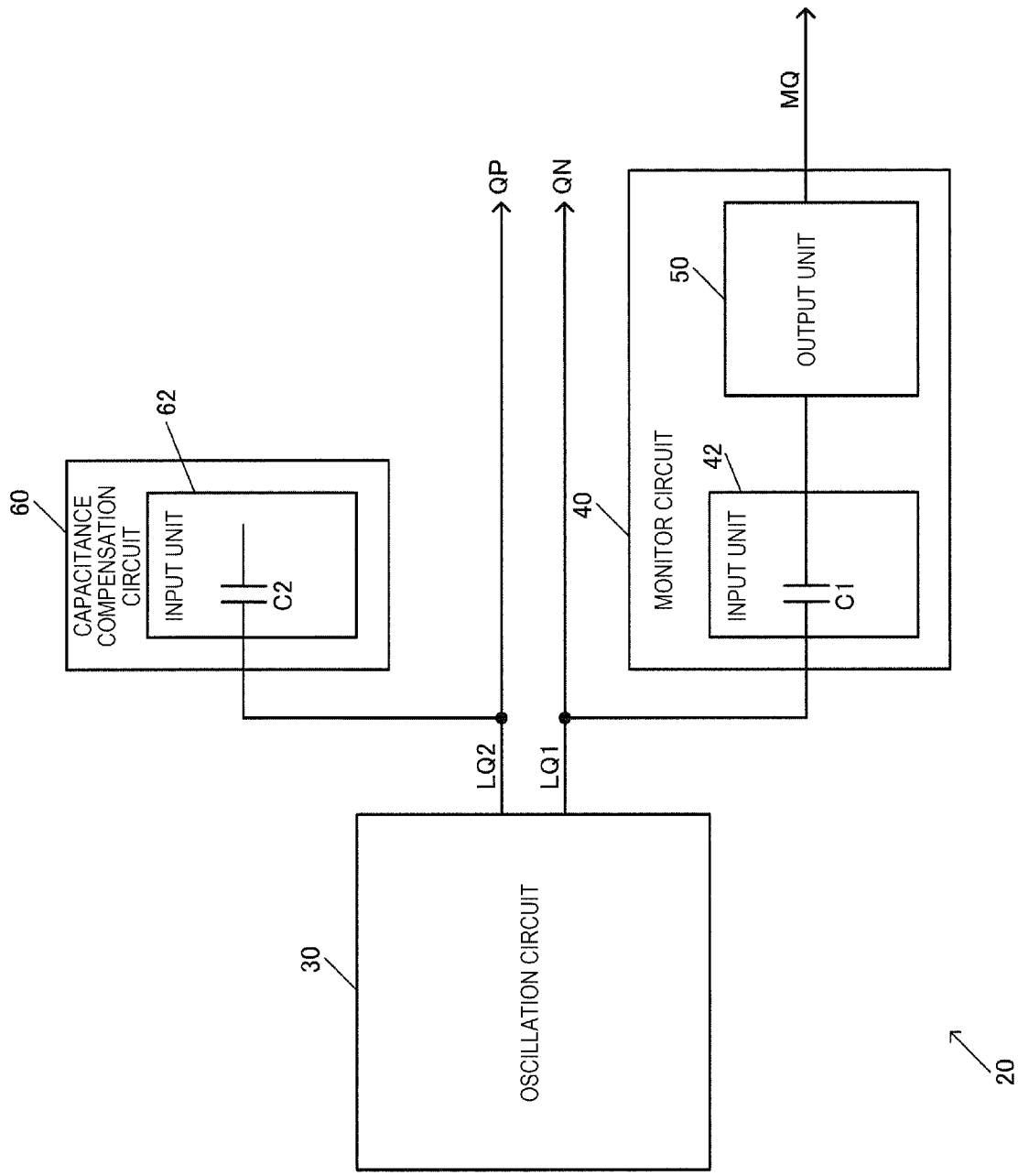
FIG. 1 is a configuration example of a circuit device of the present embodiment.

A configuration example of a circuit device 20 of the present embodiment is shown in FIG. 1. The circuit device 20 includes an oscillation circuit 30, output signal lines LQ1 and LQ2, a monitor circuit 40, and a capacitance compensation circuit 60. The output signal lines LQ1 and LQ2 are respectively a first output signal line and a second output signal line, and are coupled to the oscillation circuit 30. The monitor circuit 40 is coupled to the output signal line LQ1, and the capacitance compensation circuit 60 is coupled to the output signal line LQ2. The output signal lines LQ1 and LQ2 are signal lines of the circuit device 20, and are, for example, wires formed by a metal layer such as an aluminum layer.

The oscillation circuit 30 generates differential oscillation signals including signals QN and QP. The oscillation circuit outputs the signal QN to the output signal line LQ1, and outputs the signal QP to the output signal line LQ2. The signal QN is a first signal, and the signal QP is a second signal. The signal QN is also referred to as a negative-side signal or a negative signal. The signal QP is also referred to as a positive-side signal or a positive signal. The signals QN and QP are signals referred to balancing. In FIG. 1, the signal QN which is the negative-side signal is the first signal, and the signal QP which is the positive-side signal is the second signal. However, the signal QP may be the first signal, and the signal QN may be the second signal. In this case, the monitor circuit 40 is coupled to the output signal line of the signal QP, and the capacitance compensation circuit 60 is coupled to the output signal line of the signal QN. The coupling in the present embodiment is electrical coupling. The electrical coupling may be coupling established such that an electrical signal can be transmitted, may be coupling established such that information using the electrical signal can be transmitted, and may be coupling established through another signal line or an active element.

As will be described below, the oscillation circuit 30 is realized by, for example, an LC oscillation circuit. That is, the oscillation circuit generates the oscillation signal by using LC resonance. Here, the oscillation circuit 30 may generate the oscillation signal by using a resonator such as a quartz crystal resonator.

The monitor circuit 40 is a circuit for monitoring a signal state of the output signal line LQ1, and is a circuit which transmits the signal state as a monitor result MQ or detects the signal state. The monitor circuit 40 may be referred to as a detection circuit of the signal QN of the output signal line LQ1.

The monitor circuit 40 includes an input unit 42, and an output unit 50. The input unit 42 is a circuit for inputting the signal QN of the output signal line LQ1 of the oscillation circuit 30. The input unit 42 includes an input capacitor C1 of which a one end is coupled to the output signal line LQ1 which is the first output signal line. The input unit 42 is a first input unit, and the input capacitor C1 is a first input capacitor. The input capacitor C1 can be realized by, for example, metal-insulator-metal. The other end of the input capacitor C1 is set to, for example, a predetermined voltage.

For example, the input capacitor C1 functions as a capacitor for AC coupling which cuts a DC component of the signal QN of the output signal line LQ1 and inputs the signal to the monitor circuit 40. Accordingly, the AC component of the signal QN is input to the output unit 50. The input capacitor C1 is provided as the input unit 42 of the monitor circuit 40, and thus, influence caused by coupling the monitor circuit 40 to the output signal line LQ1 can be limited to influence caused by the addition of a capacitance using the input capacitor C1.

The output unit 50 is coupled to the input unit 42, and outputs the monitor result MQ. For example, the output unit 50 is a circuit for outputting the monitor result of the monitor circuit 40. The monitor result MQ specifies the signal state of the signal QN of the output signal line LQ1, and is an analog signal or a digital data signal. For example, the output unit 50 may output, as the monitor result MQ, a signal obtained by buffering a signal corresponding to the signal QN of the output signal line LQ1, and may output a detection signal obtained by performing detection processing on the signal QN.

The capacitance compensation circuit 60 is a circuit for compensating for influence of a first capacitance added to the output signal line LQ1 by coupling the monitor circuit 40 to the output signal line LQ1, and a capacitance adjustment circuit. For example, the influence of the first capacitance added to the output signal line LQ1 is compensated by using a second capacitance added to the output signal line LQ2 by coupling the capacitance compensation circuit 60 to the output signal line LQ2.

The capacitance compensation circuit 60 includes an input unit 62. The input unit 62 is a circuit for inputting the signal QP of the output signal line LQ2 of the oscillation circuit 30. The input unit 62 corresponds to the input unit of the monitor circuit 40, and is a dummy circuit corresponding to the input unit 42. For example, the input unit 62 has the same circuit configuration as the configuration of the input unit 42 of the monitor circuit 40. The input unit 62 includes an input capacitor C2 of which a one end is coupled to the output signal line LQ2 which is the second output signal line. The input unit 62 is a second input unit, and the input capacitor C2 is a second input capacitor. The input capacitor C2 can be realized by, for example, MIM. The other end of the input capacitor C2 is set to, for example, a predetermined voltage. For example, the input capacitor C2 has the same capacitance as the capacitance of the input capacitor C1.

As stated above, in the present embodiment, the oscillation circuit 30 generates the signals QN and QP constituting the differential oscillation signals, and outputs the generated signals to the output signal lines LQ1 and LQ2. As stated above, the differential signal of the oscillation signal of the oscillation circuit 30 is transmitted, and thus, it is possible to realize signal transmission with high stability at high speed. In the present embodiment, the monitor circuit 40 is provided for the output signal line LQ1, and the signal state of the signal QN which is the first signal is monitored. As described above, the first signal as a monitoring target may be the signal QP. It is possible to monitor whether or not the oscillation circuit 30 performs appropriate oscillation by monitoring such a signal state. For example, it is possible to monitor whether or not an amplitude of the oscillation signal is an amplitude satisfying the specification. Alternatively, it is possible to perform feedback control for an analog circuit 110 of the circuit device 20 based on the monitor result, as will be described in FIG. 6. For example, it is possible to perform feedback control such that the oscillation circuit 30 performs an appropriate oscillation operation.

Meanwhile, in the present embodiment, since the monitor circuit 40 is coupled to the output signal line LQ1, the capacitance of the input capacitor C1 of the input unit 42 of the monitor circuit 40 is added to the output signal line LQ1. In other words, when the input capacitor C1 is provided as the input unit 42 of the monitor circuit 40, the influence caused by coupling the monitor circuit 40 can be limited to the addition of the capacitance caused by the coupling of the input capacitor C1. When such a capacitance is added to one output signal line LQ1 of the output signal lines LQ1 and LQ2 for differential signal transmission of the oscillation circuit 30, since a parasitic capacitance is additionally provided at only the output signal line LQ1, there is a concern that symmetry of differential signal transmission will deteriorate and the balance between the differential oscillation signals will deteriorate. That is, the signal state of the signal QN such as amplitude or phase and the signal state of the signal QP such as amplitude or phase may be different. The deterioration in balance between the differential oscillation signals adversely influences the oscillation operation of the oscillation circuit 30 or poses a problem such as degradation in frequency accuracy of a clock signal based on the oscillation signal. For example, the amplitudes of the differential oscillation signals are different, and thus, the noise characteristics of the signal of which the amplitude is lower may deteriorate. Accordingly, there is a concern that the noise characteristics of the clock signal to be output will deteriorate.

Thus, in the present embodiment, the monitor circuit 40 is coupled to the output signal line LQ1 as the monitoring target, and the capacitance compensation circuit 60 is also coupled to the output signal line LQ2 which is not the monitoring target. The capacitance compensation circuit 60 is a circuit for compensating for the influence of the first capacitance which is the capacitance added to the output signal line LQ1 by coupling the monitor circuit 40. For example, the second capacitance which is the same capacitance as the first capacitance is provided at the capacitance compensation circuit 60, and thus, adjustment for compensating for the influence of the first capacitance is performed. The first capacitance is the capacitance of the input capacitor C1, and the second capacitance is the capacitance of the input capacitor C2. The input capacitor C2 of the second capacitance is provided at the input unit 62 of the capacitance compensation circuit 60, and thus, it is possible to compensate for the influence of the first capacitance of the input capacitor C1.

As a method of a modification example of the present embodiment, the circuit having the same configuration as the configuration of the monitor circuit 40 may be coupled to the output signal line LQ2. Here, according to this method, it is considered that the influence of the parasitic capacitance due to the monitor circuit 40 can be further reduced, whereas since the circuit having the same configuration as the configuration of the output unit 50 that performs signal buffering or detection needs to be provided at a side of the output signal line LQ2, layout efficiency in circuit arrangement of the circuit device 20 deteriorates. In the present embodiment, the input unit 62 corresponding to the input unit 42 of the monitor circuit 40 is provided in the capacitance compensation circuit 60, whereas the output unit corresponding to the output unit 50 of the monitor circuit 40 may not be provided. Accordingly, an arrangement region of the circuit of the circuit device 20 can be effectively used, and area efficiency can be improved. As stated above, according to the present embodiment, it is possible to provide the circuit device 20 capable of monitoring the signal states of the differential oscillation signals while preventing the balance between the differential oscillation signals from deteriorating and the layout efficiency of the circuit arrangement from deteriorating.

Figure 2:
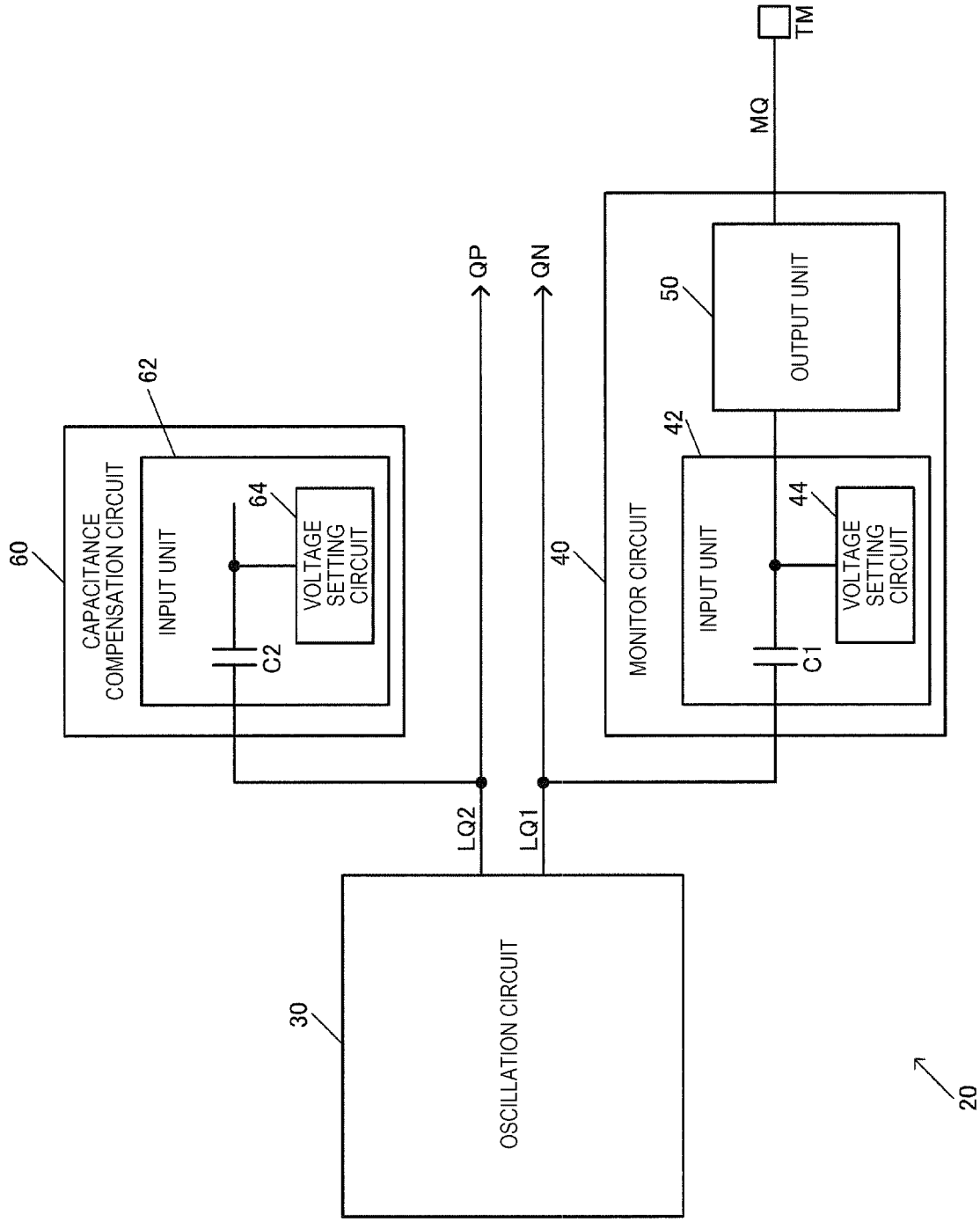
FIG. 2 is a detailed configuration example of the circuit device of the present embodiment.

FIG. 2 shows a detailed configuration example of the circuit device 20 of the present embodiment. In FIG. 2, the input unit 42 of the monitor circuit 40 includes a voltage setting circuit 44 that sets a voltage of the other-side end of the input capacitor C1. The input unit 62 of the capacitance compensation circuit 60 also has a voltage setting circuit 64 that sets a voltage of the other-side end of the input capacitor C2. The voltage setting circuits 44 and 64 are respectively a first voltage setting circuit and a second voltage setting circuit. The voltage setting circuits 44 and 64 may be referred to as bias voltage setting circuits. By providing the voltage setting circuit 44, a one end of the input capacitor C1 is coupled to the output signal line LQ1, and the other-side end of the input capacitor C1 is set to the predetermined voltage. By providing the voltage setting circuit 64, a one end of the input capacitor C2 is coupled to the output signal line LQ2, and the other-side end of the input capacitor C2 is set to the predetermined voltage. A set voltage of the voltage setting circuit 44 and a set voltage of the voltage setting circuit 64 are, for example, the same voltage.

It is possible to input the AC component of the signal QN of the output signal line LQ1 to the output unit 50 by coupling a one end of the input capacitor C1 to the output signal line LQ1 and coupling the other-side end of the input capacitor C1 to the output unit 50. The voltage setting circuit 44 sets, for example, a bias voltage to the AC component of the signal QN to be input to the output unit 50. Accordingly, a signal having a waveform in which the voltage set by the voltage setting circuit 44 as a common-mode voltage is input to the output unit 50. The common-mode voltage is a voltage as a reference of the differential signal, and is a central voltage having an amplitude of the differential signal. In the present embodiment, the voltage setting circuit 64 is provided not only for the input unit 42 of the monitor circuit 40 but also for the input unit 62 of the capacitance compensation circuit 60. In this manner, a state of the other-side end of the input capacitor C2 of the input unit 62 can be the same as the state of the other-side end of the input capacitor C1 of the monitor circuit 40.

In FIG. 2, the circuit device 20 includes a terminal TM that outputs the monitor result MQ of the monitor circuit 40. For example, the terminal TM is a pad of the circuit device 20 which is a semiconductor chip, and is a terminal for external coupling. Accordingly, a signal indicating the monitor result MQ in the monitor circuit 40 is output to the outside through the terminal TM. The signal indicating the monitor result MQ may be an analog signal, or may be a signal of digital data. The signal indicating the monitor result MQ may be a signal obtained by buffering the signal corresponding to the signal QN, or may be a detection signal obtained by performing detection processing on the signal QN. For example, the signal corresponding to the signal QN is a signal having the AC component of the signal QN. For example, the detection signal is a detection result signal for the signal state of the signal QN such as amplitude. An external device can detect or analyze the signal state of the signal QN by outputting the signal obtained by buffering the signal corresponding to the signal QN through the terminal TM. The external device can obtain the detection result of the signal state of the signal QN by outputting the detection signal for the signal QN through the terminal TM.

2. Monitor Circuit

Figure 3:
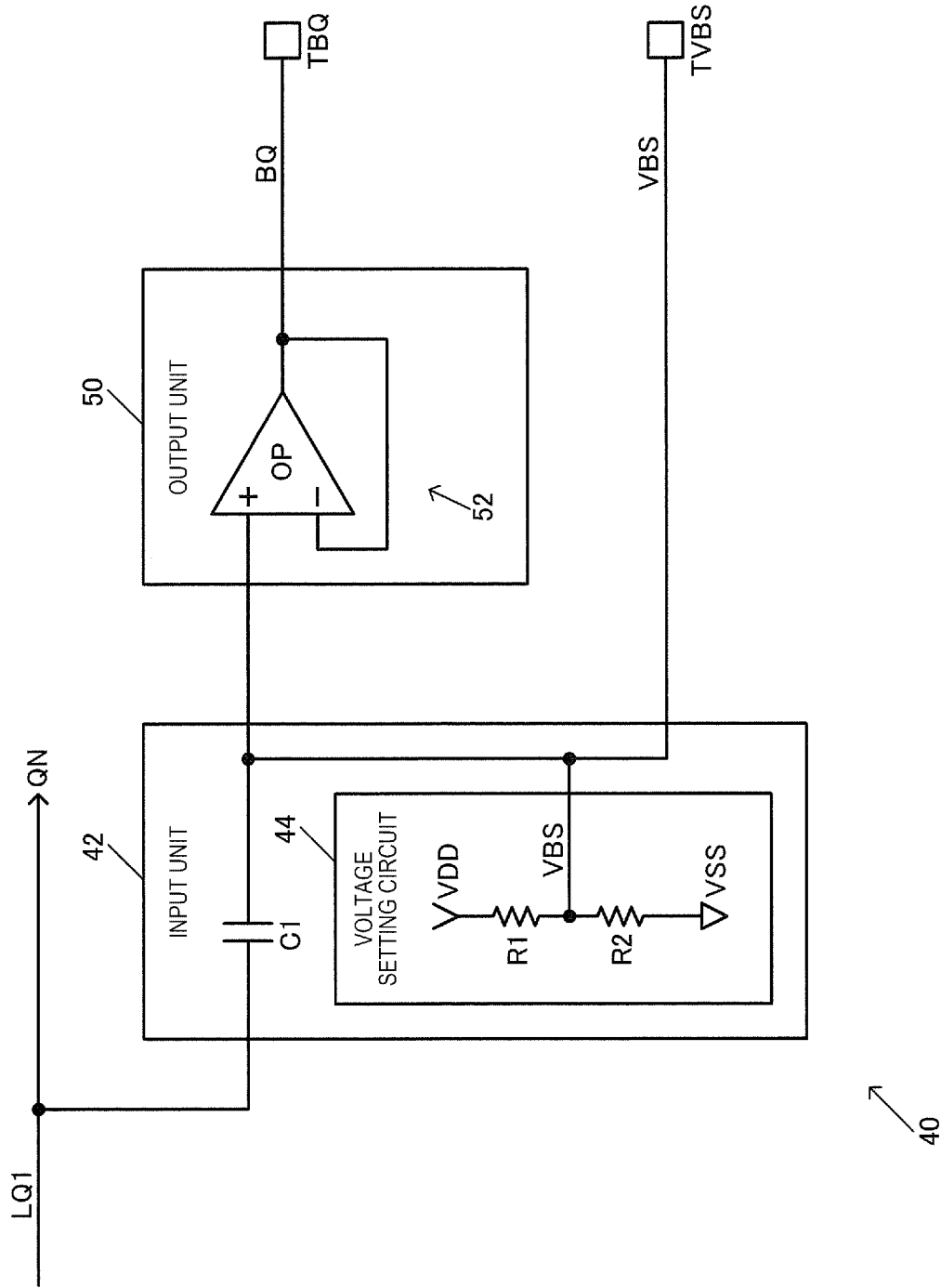
FIG. 3 is a first configuration example of a monitor circuit.

FIG. 3 shows a first configuration example of the monitor circuit 40. In FIG. 3, the output unit 50 of the monitor circuit 40 includes a buffer circuit 52 that outputs, as the monitor result, the signal obtained by buffering an input signal from the input unit 42. For example, an input signal corresponding to the AC component of the signal QN is input to the output unit 50 from the other-side end of the input capacitor C1 of the input unit 42. The buffer circuit 52 of the output unit 50 outputs, as the monitor result, a signal BQ obtained by buffering the input signal. For example, the buffered signal BQ is output to the outside through a terminal TBQ. The terminal TBQ corresponds to the terminal TM of FIG. 2.

The buffer circuit 52 is an analog buffer circuit, and can be realized by, for example, a voltage follower constituted by an operational amplifier OP. For example, the other-side end of the input capacitor C1 is coupled to a non-inverting input terminal which is a first terminal of an operational amplifier OP, and an output terminal of the operational amplifier OP is coupled to an inverting input terminal which is a second terminal of the operational amplifier OP. Such a buffer circuit 52 is used, and thus, low impedance of the signal BQ output from the output unit 50 is achieved. Accordingly, the external device that receives the signal BQ through the terminal TBQ can perform detection processing or analysis processing of the signal BQ in an appropriate signal state. For example, the external device can perform the detection processing or the analysis processing of the signal BQ corresponding to the signal QN in substantially the same signal state as the state of the signal QN at the output signal line LQ1.

In FIG. 3, the voltage setting circuit 44 is realized by a voltage dividing circuit. Specifically, the voltage setting circuit 44 includes resistors R1 and R2 coupled in series between a node of VDD which is a power supply voltage at a high potential side and a node of VSS which is a power supply voltage at a low potential side. A divided voltage of VDD and VSS due to the resistors R1 and R2 is set, as a voltage VBS, to the other-side end of the input capacitor C1. Accordingly, a signal with the voltage VBS as a reference voltage such as the common-mode voltage is input to the buffer circuit 52 of the output unit 50. The voltage setting circuit 64 of the capacitance compensation circuit 60 of FIG. 2 is also realized by the circuit having the same configuration as the configuration of the voltage setting circuit 44 of FIG. 3. That is, the voltage setting circuit 64 is realized by a voltage dividing circuit of VDD and VSS using resistors. For example, the voltage setting circuits 44 and 64 may be realized by analog bias voltage setting circuits using reference voltage generation circuits.

In FIG. 3, the circuit device 20 includes a terminal TVBS that outputs a set voltage of the voltage setting circuit 44. That is, the voltage VBS which is the set voltage of the voltage setting circuit 44 is output to the outside through the terminal TVBS. Accordingly, the reference voltage such as the common-mode voltage corresponding to the central voltage of the signal BQ can be output as the voltage VBS to the external device that performs the detection processing or the analysis processing of the signal BQ from the output unit 50 through the terminal TVBS.

Figure 4:
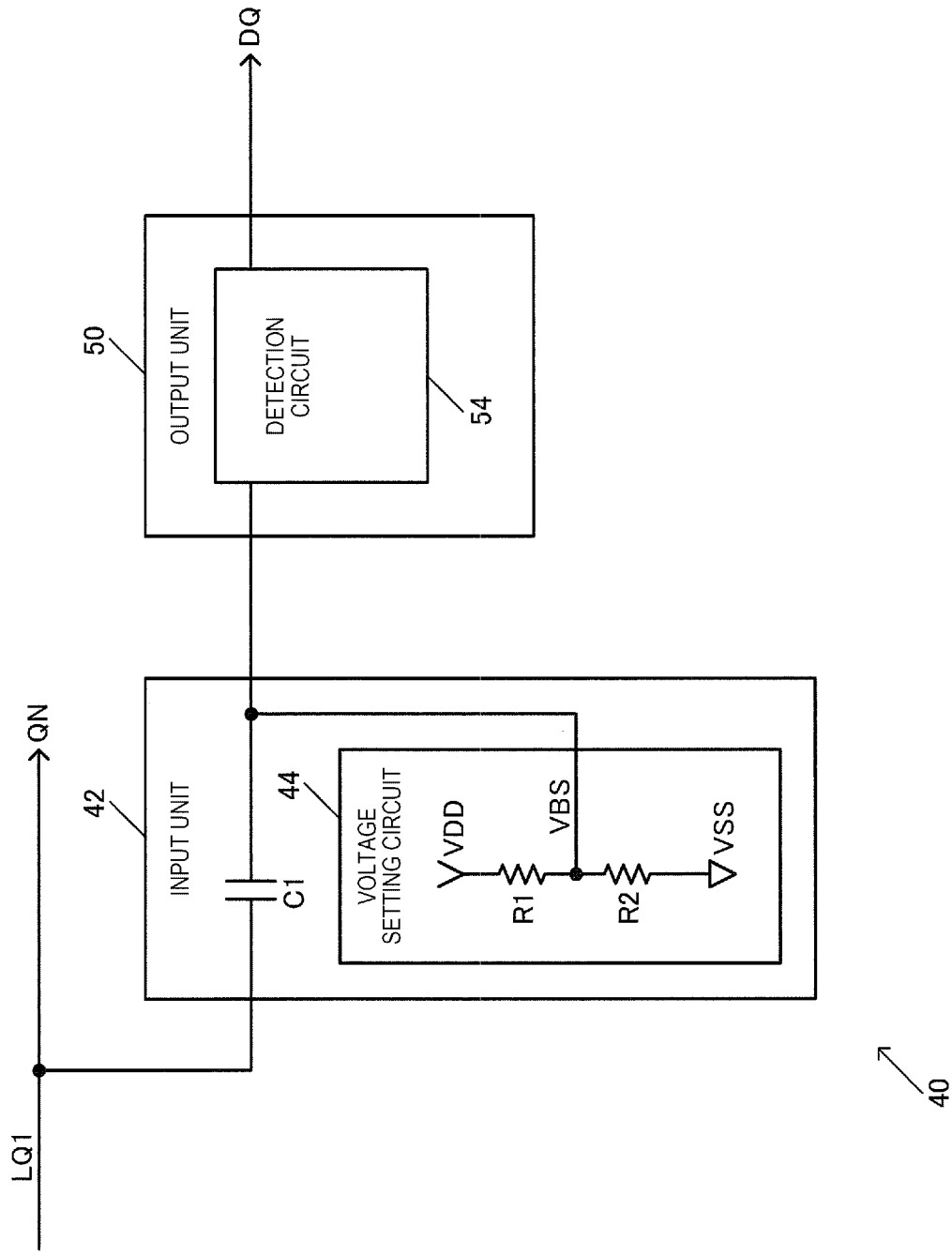
FIG. 4 is a second configuration example of the monitor circuit.

FIG. 4 shows a second configuration example of the monitor circuit 40. In FIG. 4, the output unit 50 of the monitor circuit 40 includes a detection circuit 54 that outputs, as the monitor result, the detection result for the input signal from the input unit 42. For example, the detection circuit 54 performs the detection processing in the signal state such as amplitude detection on the input signal from the other-side end of the input capacitor C1 of the input unit 42. The detection circuit 54 outputs a detection signal DQ as the detection result which is the monitor result. For example, the detection processing such as the amplitude detection in the detection circuit 54 can be realized by a comparison circuit that compares the voltage of the input signal from the input unit 42 with a comparison voltage such as the reference voltage. It is possible to detect which amplitude range the amplitude of the input signal is within by using a plurality of voltages as the comparison voltage. In this case, the voltage with the voltage VBS set by the voltage setting circuit 44 as the reference can be used as the comparison voltage. Alternatively, the detection processing such as the amplitude detection may be realized by an envelope detection. For example, the input signal from the input unit 42 is rectified by a rectification circuit, and the amplitude of the input signal is determined based on a rectified DC voltage. As stated above, the detection circuit 54 is provided at the output unit 50, and thus, the signal state such as the amplitude of the signal QN can be determined by the detection signal DQ from the detection circuit 54. Accordingly, the circuit device 20 or the external device can perform appropriate processing corresponding to the detection result.

Figure 5:
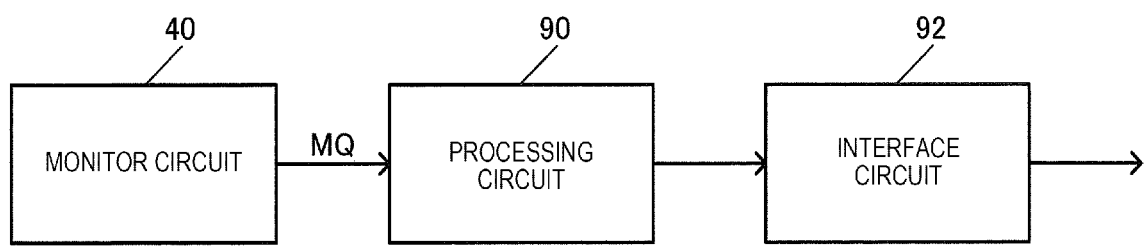
FIG. 5 is an explanatory diagram of a method of outputting a monitor result of the monitor circuit to a processing circuit.

In FIG. 2 described above, the monitor result MQ of the monitor circuit 40 is output to the outside through the terminal TM. Specifically, as shown in FIG. 3, the signal BQ from the output unit 50 is output to the outside through the terminal TBQ, and the present embodiment is not limited thereto. For example, as shown in FIG. 5, the monitor result MQ of the monitor circuit 40 may be output to a processing circuit 90. The processing circuit 90 receives the monitor result MQ from the monitor circuit 40, and outputs data corresponding to the monitor result MQ to the outside through an interface circuit 92. The interface circuit 92 is a circuit that realizes an interface such as I2C or SPI. In this manner, it is possible to output the monitor result MQ to the external device through the interface circuit 92 without providing the terminal TM that outputs the monitor result MQ. For example, it is possible to output the detection data for the amplitude to the external device through the interface circuit 92.

Figure 6:
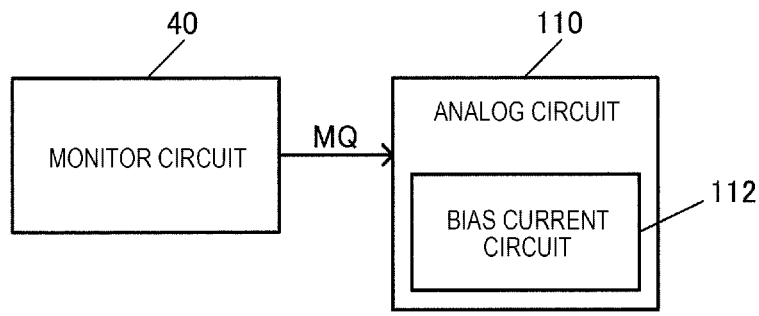
FIG. 6 is an explanatory diagram of a method of controlling an analog circuit based on the monitor result of the monitor circuit.

In the present embodiment, as shown in FIG. 6, the analog circuit 110 of the circuit device 20 may be controlled based on the monitor result MQ in the monitor circuit 40. For example, in FIG. 6, a bias current circuit 112 is provided as the analog circuit 110, and a bias current flowing to the bias current circuit 112 is controlled based on the monitor result MQ in the monitor circuit 40. For example, the bias current is used in a PLL circuit 70 of FIG. 11 to be described below. For example, if feedback control based on the monitor result MQ is performed, an appropriate operation of the analog circuit 110 can be performed. For example, it is possible to realize an appropriate PLL operation of the PLL circuit 70 which is the analog circuit 110 or an appropriate oscillation operation of the oscillation circuit 30. Alternatively, the detection of a locked state of the PLL circuit 70 may be performed based on the monitor result MQ of the monitor circuit 40.

3. Oscillation Circuit

Figure 7:
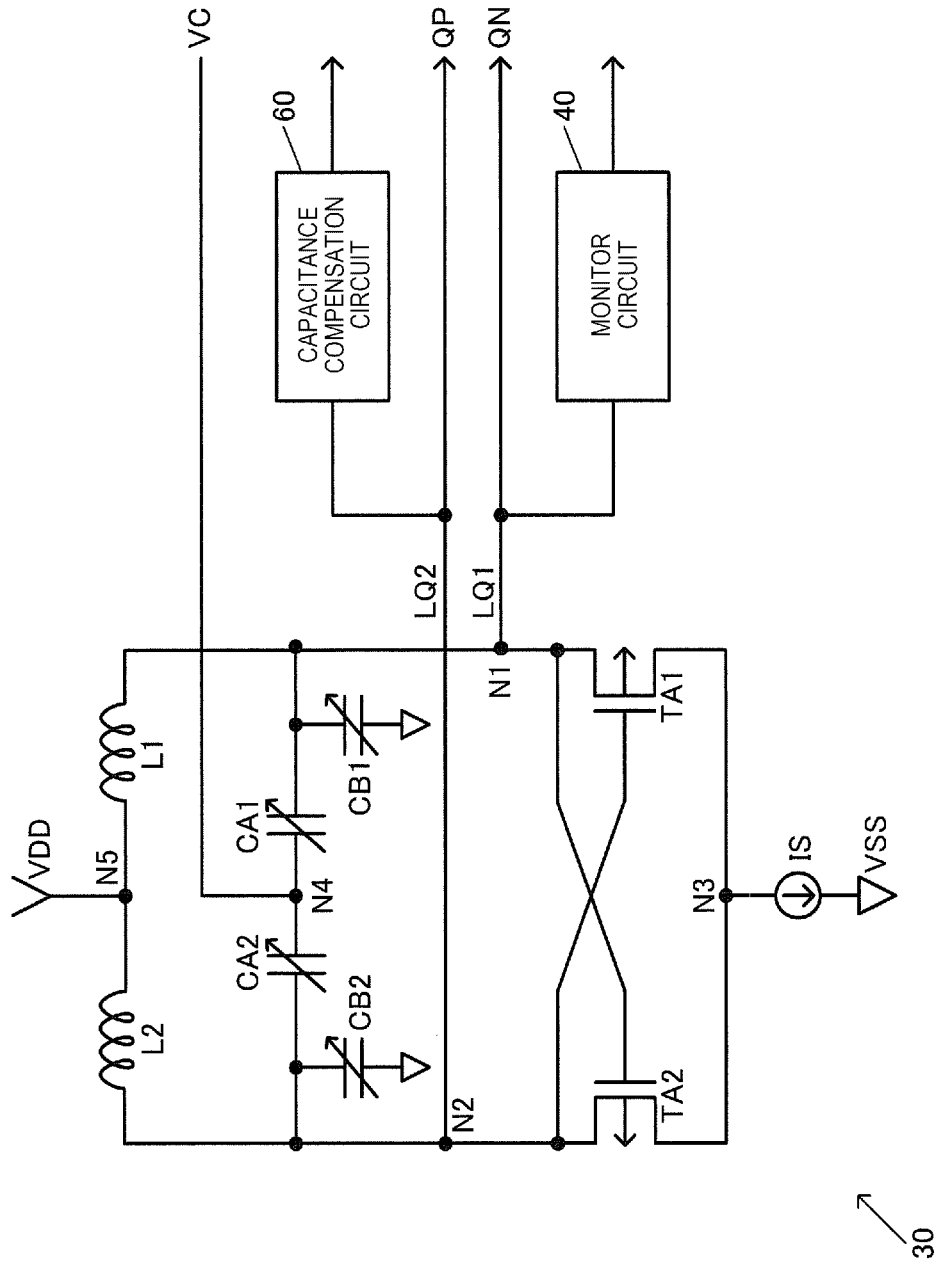
FIG. 7 is a configuration example of an oscillation circuit.

FIG. 7 shows a configuration example of the oscillation circuit 30. For example, the oscillation circuit 30 of the present embodiment is an LC oscillation circuit including an inductor and a capacitor.

For example, in the oscillation circuit 30 having the configuration of FIG. 7, a transistor TA1 is provided between a node N1 which is a coupling node of the output signal line LQ1 and a node N3, and a transistor TA2 is provided between a node N2 which is a coupling node of the output signal lines LQ2 and the node N3. A current source IS is provided between the node N3 and the node of VSS. For example, the transistors TA1 and TA2 are N-type transistors which are first conductive types. A gate of the transistor TA1 is coupled to the node N2, and a gate of the transistor TA2 is coupled to the node N1. For example, the current source IS can be realized by the N-type transistor in which the bias voltage is set to the gate.

In the oscillation circuit 30 of FIG. 7, an inductor L1 is provided between a node N5 of VDD and the node N1, and an inductor L2 is provided between the node N5 of VDD and the node N2. That is, one ends of the inductors L1 and L2 are commonly coupled to the node N5 of VDD, and other-side ends of the inductors L1 and L2 are coupled to the nodes N1 and N2.

A control voltage VC for controlling an oscillation frequency of the oscillation circuit 30 is applied to a node N4 of the oscillation circuit 30. For example, in FIG. 11 to be described below, the control voltage VC is input to the oscillation circuit 30 from a low-pass filter 73 of the PLL circuit 70. A capacitor CA1 is provided between the node N4 and the node N1, and a capacitor CA2 is provided between the node N4 and the node N2. The capacitor CA1 is a first capacitor, and the capacitor CA2 is a second capacitor. The capacitors CA1 and CA2 are capacitors of which the capacitances are variable, and can be realized by, for example, varactors. The varactor is a capacitor of which electrostatic capacitance is changed by an applied voltage, and is also referred to as a variable capacitance diode or a varicap. The control voltage VC is applied to the one ends of the capacitors CA1 and CA2 of which the capacitances are variable which are realized by such varactors, and thus, a resonance frequency of an LC resonant circuit using the inductors L1 and L2 and the capacitors CA1 and CA2 is changed. Accordingly, it is possible to control the oscillation frequency of the oscillation circuit 30.

Figure 10:
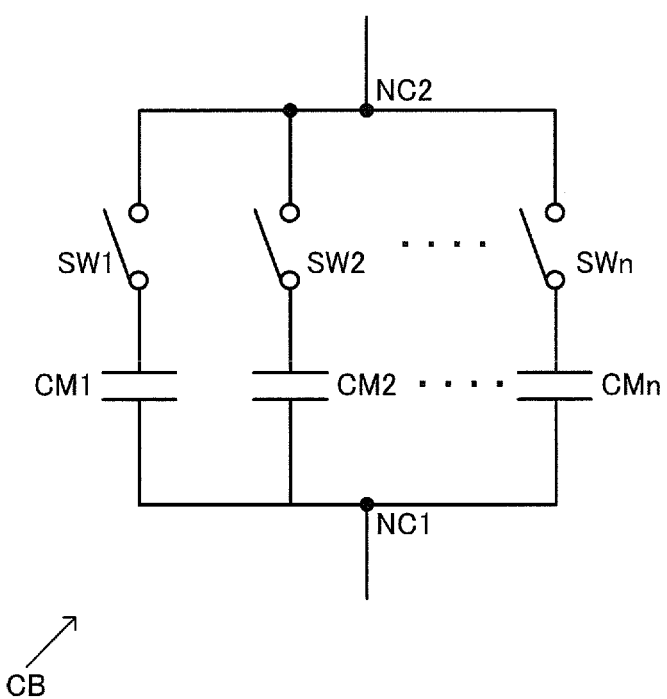
FIG. 10 is a configuration example of a variable capacitance capacitor using MIM.

In the oscillation circuit 30 of FIG. 7, a capacitor CB1 is provided between the node N1 and the node of VSS, and a capacitor CB2 is provided between the node N2 and the node of VSS. The capacitor CB1 is a first capacitor, and the capacitor CB2 is a second capacitor. For example, the capacitors CB1 and CB2 are capacitors of which the capacitances are variable, and can be realized by a capacitor array of MIM capacitors and a switch array of switch elements, as shown in FIG. 10 to be described below. For example, the turning on or off of the switch elements of the switch array is controlled based on frequency setting data, and thus, it is possible to variably adjust the capacitances of the capacitors CB1 and CB2. The capacitances of the capacitors CB1 and CB2 are changed, and thus, the fine adjustment of the frequency of the oscillation circuit 30 can be realized. For example, the capacitances of the capacitors CB1 and CB2 are adjusted at the time of shipment or inspection of the product of the circuit device 20, and thus, the oscillation frequency of the oscillation circuit 30 can be included within a range of the specification of a normal frequency.

Figure 8:
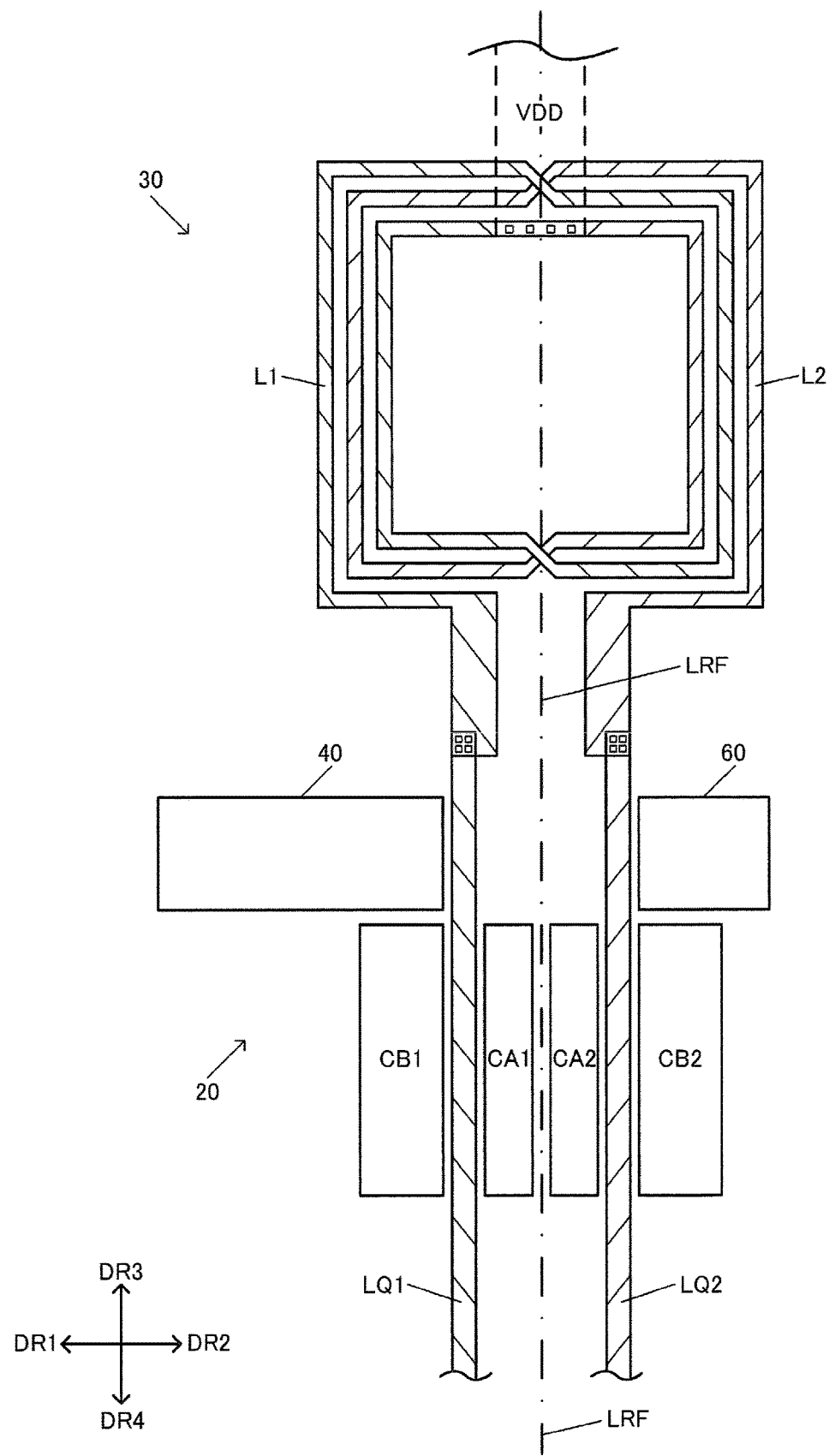
FIG. 8 is a layout arrangement example of the circuit device.

FIG. 8 shows a layout arrangement example of the circuit device 20 of the present embodiment. A partial layout arrangement of the oscillation circuit 30, the monitor circuit 40, and the capacitance compensation circuit 60 of the circuit device 20 is primarily shown in FIG. 8. The layout arrangement shows a physical arrangement of a circuit block or a circuit element which is the semiconductor chip of the circuit device 20. In FIG. 8, an opposite direction of a direction DR1 is a direction DR2, a direction perpendicular to the direction DR1 is a direction DR3, and an opposite direction of the direction DR3 is a direction DR4. The directions DR1, DR2, DR3, and DR4 are respectively, a first direction, a second direction, a third direction, and a fourth direction.

In FIG. 8, the output signal lines LQ1 and LQ2 of the oscillation circuit 30 are, for example, wired along the direction DR3. For example, the output signal lines LQ1 and LQ2 are wired in parallel with each other. A reference line between the output signal lines LQ1 and LQ2 is LRF. The reference line LRF is a line along the direction DR3. For example, the reference line LRF is a line corresponding to a symmetry axis in the layout arrangement of the oscillation circuit 30. For example, a layout arrangement in which the oscillation circuit 30 is disposed in a line symmetry with respect to the reference line LRF is achieved. Such a layout arrangement is achieved, and thus, it is possible to prevent the balance of the differential signal transmission from deteriorating.

The monitor circuit 40 is disposed at a side of the direction DR1 of the reference line LRF between the output signal line LQ1 and the output signal line LQ2. For example, the output signal lines LQ1 and LQ2 are wired along the direction DR3, and the monitor circuit 40 is disposed at the side of the direction DR1 perpendicular to the direction DR3 with the reference line LRF as the reference. When the opposite direction of the direction DR1 is the direction DR2, the capacitance compensation circuit 60 is disposed at a side of the direction DR2 of the reference line LRF. For example, the monitor circuit 40 and the capacitance compensation circuit 60 are arranged along the direction DR2, and the output signal lines LQ1 and LQ2 are wired along the direction DR3 between the monitor circuit 40 and the capacitance compensation circuit 60.

Such an arrangement is achieved, and thus, the monitor circuit 40 and the capacitance compensation circuit 60 can be arranged symmetrically with respect to the output signal lines LQ1 and LQ2. Accordingly, it is possible to improve the symmetry of the layout arrangement of the output signal lines LQ1 and LQ2, the monitor circuit 40, and the capacitance compensation circuit 60, and it is possible to restrain the balance of the differential signal transmission from deteriorating.

In the capacitance compensation circuit 60, the input unit 62 is provided, and the circuit corresponding to the output unit 50 provided in the monitor circuit 40 is not provided. Accordingly, as shown in FIG. 8, for example, a region at the side of the direction DR2 of the capacitance compensation circuit 60 is an empty space, and another circuit element such as a capacitor between the power supplies can be disposed or the empty space can be used as a wiring region. Accordingly, it is possible to improve the layout efficiency, and it is possible to reduce the area of the circuit device 20.

The oscillation circuit 30 of FIG. 8 is the LC oscillation circuit including the inductors L1 and L2 and the capacitors CA1 and CA2 as shown in FIG. 7. When the direction perpendicular to the direction DR1 is the direction DR3, the inductors L1 and L2 are arranged at a side of the direction DR3 of the monitor circuit 40 and the capacitance compensation circuit 60 as shown in FIG. 8. For example, the inductors L1 and L2 are formed by winding a metal wire such as an aluminum layer by multiple times. For example, the inductor L1 is formed by winding the metal wire in a clockwise direction, and the inductor L2 is formed by winding the metal wire in a counterclockwise direction. For example, the metal wire of the inductor L1 and the metal wire of the inductor L2 are wired so as to be wound in parallel with each other. For example, in a region at the side of the direction DR1 with respect to the reference line LRF, the metal wire of the inductor L1 is wired at the outermost circumference, the metal wire of the inductor L2 is wired at the inside of the inductor L1, and the metal wire of the inductor L1 is wired at the inside of the inductor L2. Meanwhile, in the region at the side of the direction DR2 with respect to the reference line LRF, the metal wire of the inductor L2 is wired at the outermost circumference, the metal wire of the inductor L1 is wired at the inside of the inductor L2, and the metal wire of the inductor L2 is wired at the inside of the inductor L1. A one end of the inductor L1 is coupled to the monitor circuit 40 through a signal line or a contact, and a one end of the inductor L2 is coupled to the capacitance compensation circuit 60 through a signal line or a contact. Meanwhile, the other-side ends of the inductors L1 and L2 are coupled to a power supply line of VDD through a contact. The power supply line of VDD is wired at the side of the direction DR3 of the inductors L1 and L2.

According to such an arrangement method of the inductors, it is possible to achieve the layout arrangement of the inductors L1 and L2 by effectively using a region at the side of the direction DR3 of the monitor circuit 40 and the capacitance compensation circuit 60, and it is possible to improve the layout efficiency. It is possible to shorten the lengths of the wires that couple the monitor circuit 40, the capacitance compensation circuit 60, and the inductors L1 and L2, and it is possible to reduce bad influence of a parasitic element such as parasitic resistor. For example, the inductor L1 can be formed by winding the metal wire such that the output signal line LQ1 is coupled to the monitor circuit 40 disposed at the side of the direction DR1 with respect to the reference line LRF and the metal wire is coupled to the output signal line LQ1. The inductor L2 can be formed by winding the metal wire such that the output signal line LQ2 is coupled to the capacitance compensation circuit 60 disposed at the side of the direction DR2 with respect to the reference line LRF and the metal wire is coupled to the output signal line LQ1.

As shown in FIG. 7, the oscillation circuit 30 includes the capacitors CA1 and CB1 of which one ends are coupled to the output signal line LQ1 and the capacitances are variable, and the capacitors CA2 and CB2 of which the one ends are coupled to the output signal line LQ2 and the capacitances are variable. The capacitors CA1 and CB1 are the first capacitors, and the capacitors CA2 and CB2 are the second capacitors. The capacitors CA1 and CA2 can be realized by, for example, varactors, and the capacitors CB1 and CB2 can be realized by, for example, variable capacitance capacitors each including the MIM capacitor array and the switch array. As shown in FIG. 8, the capacitors CA1 and CB1 are arranged at the side of the direction DR1 with respect to the reference line LRF. Specifically, the capacitor CA1 is disposed between the reference line LRF and the output signal line LQ1, and the capacitor CB1 is disposed at the side of the direction DR1 of the output signal line LQ1. Meanwhile, the capacitors CA2 and CB2 are arranged at the side of the direction DR2 with respect to the reference line LRF. Specifically, the capacitor CA2 is disposed between the reference line LRF and the output signal line LQ2, and the capacitor CB2 is disposed at the side of the direction DR2 of the output signal line LQ2. In FIGS. 7 and 8, the capacitors CB1 and CB2 for the fine adjustment of the oscillation frequency are provided. However, a modification example in which the capacitors CB1 and CB2 are not provided can be made.

As stated above, the capacitors CA1, CB1, CA2, and CB2 of which the capacitances are variable are provided, and thus, the control or initial adjustment of the oscillation frequency of the oscillation circuit 30 can be performed. According to the arrangement method of the capacitors shown in FIG. 8, the capacitors CA1, CB1, CA2, and CB2 can be coupled with a short path to the output signal lines LQ1 and LQ2 wired along the reference line LRF. Accordingly, it is possible to improve the layout efficiency, it is possible to reduce the area of the circuit device 20, and it is possible to restrain a situation in which the oscillation frequency varies due to the parasitic capacitance caused by routing the signals. It is possible to arrange the capacitors CA1 and CB1 and the capacitors CA2 and CB2 symmetrically with respect to the reference line LRF, and it is possible to prevent the balance of the differential signal transmission from deteriorating.

Figure 9:
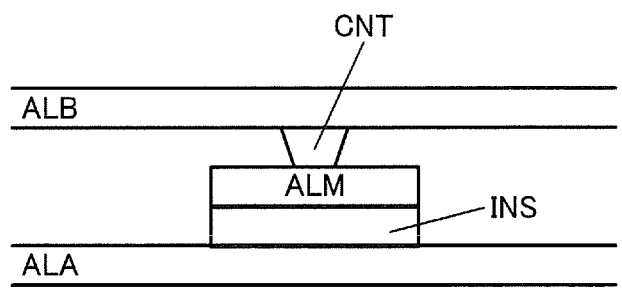
FIG. 9 is a structure example of an MIM capacitor.

FIG. 9 shows a structure example of an MIM capacitor CM as the input capacitor C1 or C2 or the capacitor CB1 or CB2. In FIG. 9, an MIM aluminum layer ALM is formed between a lower aluminum layer ALA and a high aluminum layer ALB which are metal layers. The higher aluminum layer ALB and the MIM aluminum layer ALM are electrically coupled through a contact CNT. The MIM capacitor CM is constituted by the aluminum layer ALM, the aluminum layer ALA, and an insulating layer INS formed between the aluminum layer ALM and the aluminum layer ALA.

FIG. 10 shows a configuration example of a variable capacitance capacitor CB constituted by an MIM capacitor array and a switch array. The variable capacitance capacitor CB corresponds to the capacitor CB1 or CB2 of FIG. 7, and is a variable capacitance circuit. The variable capacitance capacitor CB includes the capacitor array constituted by a plurality of MIM capacitors CM1 to CMn and the switch array constituted by a plurality of switch elements SW1 to SWn of which one ends are coupled to the capacitors CM1 to CMn. The capacitors CM1 to CMn as the capacitor array and the switch elements SW1 and SWn as the switch array are provided in series between a node NC1 and a node NC2. The turning on or off of the switch elements SW1 to SWn is controlled, and thus, the capacitance of the variable capacitance capacitor CB is set.

4. Oscillator

Figure 11:
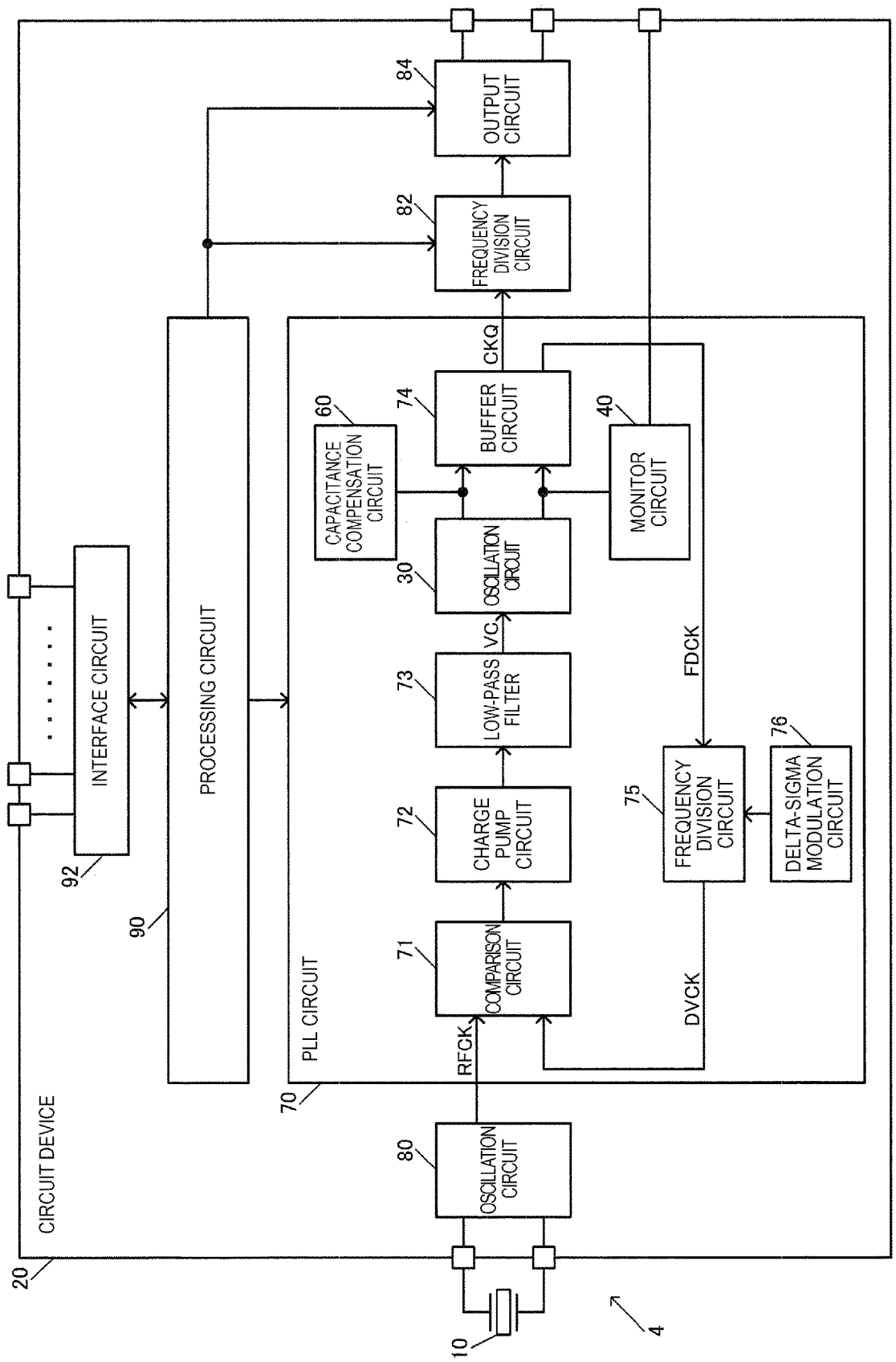
FIG. 11 is a configuration example of an oscillator.

FIG. 11 shows a configuration example of an oscillator 4 of the present embodiment. The oscillator 4 includes the circuit device 20 and a resonator 10 of the present embodiment. The resonator 10 is electrically coupled to the circuit device 20. For example, the resonator 10 and the circuit device 20 are electrically coupled by using internal wires, bonding wires, or metal bumps of a package that accommodates the resonator 10 and the circuit device 20. The resonator 10 is used for generating the differential oscillation signals in the oscillation circuit 30. In FIG. 11, an oscillation circuit 80 performs an oscillation operation for oscillating the resonator 10, and thus, a reference clock signal RFCK is generated, and the oscillation signal in the oscillation circuit 30 is generated by using the reference clock signal RFCK. Specifically, the oscillation circuit 30 is used as voltage controlled oscillator (VCO) of the PLL circuit 70 of the circuit device 20, and the PLL circuit 70 generates a clock signal CKQ by using the reference clock signal RFCK generated by using the resonator 10 and the oscillation circuit 30 which is the VCO.

The resonator 10 is an element that generates mechanical vibration by an electrical signal. For example, the resonator 10 may be realized by a resonator element such as a quartz crystal resonator element. For example, the resonator 10 may be realized by a quartz crystal resonator element that has a cut angle of AT cut or SC cut and performs thickness-shear vibration. For example, the resonator 10 may be a resonator of a simple packaged crystal oscillator (SPXO). Alternatively, the resonator 10 may be a resonator built in a thermostatic crystal oscillator (OCXO) including a thermostatic chamber, or may be a resonator built in a temperature compensated crystal oscillator (TCXO) not including a thermostatic chamber. For example, the resonator 10 of the present embodiment may be realized by various resonator elements such as a resonator element other than the thickness-shear resonator and a piezoelectric resonator element made of a material other than quartz crystal. For example, a surface acoustic wave (SAW) resonator or a micro electro mechanical systems (MEMS) resonator as a silicon resonator formed by using a silicon substrate may be adopted as the resonator 10.

The circuit device 20 is an integrated circuit (IC) manufactured through a semiconductor process, and is a semiconductor chip at which a circuit element is formed on the semiconductor substrate. The circuit device 20 includes the PLL circuit 70. That is, the circuit device 20 includes a comparison circuit 71, a charge pump circuit 72, a low-pass filter 73, and the oscillation circuit 30. The circuit device 20 can include an oscillation circuit 80, a dividing circuit 82, an output circuit 84, the processing circuit 90, and the interface circuit 92.

The oscillation circuit 80 oscillates the resonator 10, and generates the reference clock signal RFCK which is the oscillation signal. For example, the circuit device 20 includes first and second resonator terminals. A one end of the resonator 10 which is an external component of the circuit device 20 is coupled to the first resonator terminal, and the other end of the resonator 10 is coupled to a second resonator terminal. The oscillation circuit 80 includes an oscillation buffer circuit provided between the first resonator terminal and the second resonator terminal.

The PLL circuit 70 receives, as an input, the reference clock signal RFCK from the oscillation circuit 80, and generates the clock signal CKQ having a frequency obtained by multiplying the frequency of the reference clock signal RFCK. The PLL circuit 70 of FIG. 11 is a circuit example of a fractional-N phase locked loop (PLL). Specifically, the PLL circuit 70 includes the comparison circuit 71, the charge pump circuit 72, the low-pass filter 73, the oscillation circuit 30, the monitor circuit 40, and the capacitance compensation circuit 60. The PLL circuit 70 can include a buffer circuit 74, a dividing circuit 75, and a delta-sigma modulation circuit 76.

The comparison circuit 71 compares the reference clock signal RFCK with a clock signal DVCK. That is, the comparison circuit 71 compares the reference clock signal RFCK generated by using the resonator 10 with the clock signal DVCK based on the signals QN and QP which are the first and second signals generated by the oscillation circuit 30. For example, the comparison circuit 71 compares the phases or frequencies of the reference clock signal RFCK and the clock signal DVCK which is a feedback signal from the oscillation circuit 30. The charge pump circuit 72 performs a charge pump operation based on the comparison result of the comparison circuit 71. For example, the comparison circuit 71 performs the phase comparison of the reference clock signal RFCK and the clock signal DVCK, and outputs, as output signals, an up signal and a down signal which are the comparison results. The charge pump circuit 72 converts the output signals of the comparison circuit 71 into output currents. That is, the up signal and the down signal which are rectangular voltage pulses are converted into output currents which are rectangular current pulses. For example, the charge pump circuit 72 outputs a positive current pulse when the up signal is input, and outputs a negative current pulse when the down signal is input. The low-pass filter 73 performs smoothing of the output signal of the charge pump circuit 72, generates the control voltage VC for controlling the oscillation frequency of the oscillation circuit 30 which is the VCO, and outputs the generated voltage to the oscillation circuit 30. Specifically, the low-pass filter 73 performs current-voltage conversion on the output current of the charge pump circuit 72, and performs filter processing. The control voltage VC which is the output voltage of the low-pass filter 73 rises when the up signal is output, and falls when the down signal is output.

The control voltage VC from the low-pass filter 73 is input to the oscillation circuit 30 of FIG. 7, and thus, the capacitances of the capacitors CA1 and CA2 which are the varactors are changed. Accordingly, the oscillation frequency of the oscillation circuit 30 is controlled. The signals QN and QP having the oscillation frequency set by the control voltage VC are output to the buffer circuit 74. In the present embodiment, the signal state of the signal QN is monitored by the monitor circuit 40, and the monitor result is output from the terminal of the circuit device 20.

Based on the differential signals QN and QP, the buffer circuit 74 outputs the clock signal CKQ to the dividing circuit 82, and outputs a clock signal FDCK for feedback to the dividing circuit 75. In the present embodiment, a fractional frequency divider is constituted by the dividing circuit 75 and the delta-sigma modulation circuit 76. The fractional frequency divider divides the clock signal FDCK for feedback by using a reciprocal of a multiplication rate of the PLL circuit 70 as a division ratio, and outputs the divided clock signal DVCK to the comparison circuit 71. The delta-sigma modulation circuit 76 performs delta-signal conversion on a value of a fraction part of the division ratio, and generates a modulation value which is an integer. The sum of a value of an integer part of the division ratio and the modulation value is set as a set value of the division ratio to the dividing circuit 75. Accordingly, the fractional-N PLL circuit is realized.

The dividing circuit 82 divides the clock signal CKQ from the PLL circuit 70 based on the set value of the division ratio from the processing circuit 90, and outputs the divided clock signal to the output circuit 84. For example, the output circuit 84 outputs the clock signal to the outside of the circuit device 20 with signal waveform of low voltage differential signaling (LVDS), positive emitter coupled logic (PECL), high speed current steering logic (HCSL), and a differential complementary MOS (CMOS). For example, the output circuit 84 may be a circuit capable of outputting clock signals having all the signal waveforms of LVDS, PECL, HCSL, and CMOS. In this case, the output circuit 84 outputs the clock signal having the signal waveform set by the processing circuit 90.

The processing circuit 90 performs various control processing or setting processing of the circuit device 20. For example, the processing circuit 90 performs control processing of each circuit block of the circuit device 20. The processing circuit 90 may perform digital signal processing such as temperature compensation processing, aging correction processing, or digital filter processing. When the temperature compensation processing is performed, a temperature sensor is provided, and the processing circuit 90 performs the temperature compensation processing for compensating for temperature characteristics of the oscillation frequency based on temperature detection information from the temperature sensor, and outputs frequency control data for controlling the oscillation frequency. Specifically, the processing circuit 90 performs the temperature compensation processing for canceling or suppressing variation in oscillation frequency caused by a change in temperature based on temperature detection data changed depending on the temperature and data of temperature compensation coefficient which is an approximation function. The processing circuit 90 may be realized by a circuit of an application specific integrated circuit (ASIC) using automatic placement and routing such as a gate array. Alternatively, the processing circuit 90 may be realized by a processor such as a digital signal processor (DSP) or a central processing unit (CPU).

The interface circuit 92 is a circuit that realizes an interface such as Inter Integrated Circuit (I2C) or Serial Peripheral Interface (SPI). That is, the interface circuit 92 performs interface processing between the oscillator 4 and an external device. The monitor result of the monitor circuit 40 may be output to the outside through the interface circuit 92.

5. Electronic Apparatus and Vehicle

Figure 12:
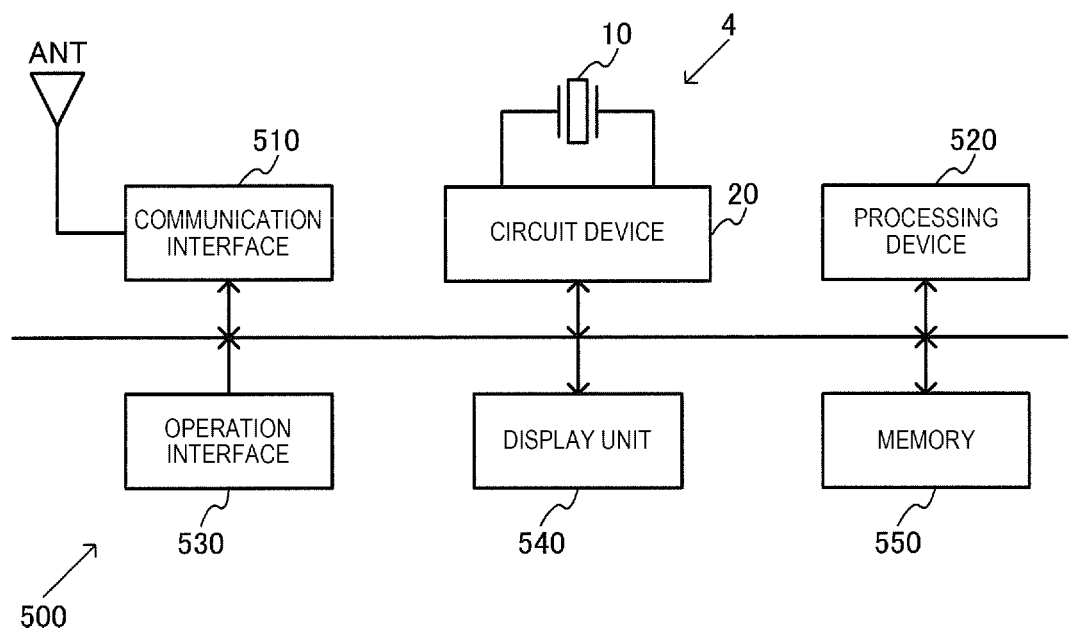
FIG. 12 is a configuration example of an electronic apparatus.

FIG. 12 shows a configuration example of an electronic apparatus 500 including the circuit device 20 of the present embodiment. The electronic apparatus 500 includes the resonator 10, the circuit device 20, and a processing device 520. The electronic apparatus 500 may include an antenna ANT, a communication interface 510, an operation interface 530, a display unit 540, and a memory 550. The resonator 10 and the circuit device 20 constitute the oscillator 4. The electronic apparatus 500 is not limited to the configuration of FIG. 12, and some components may be omitted from the configuration or other components may be added to the configuration. That is, various modification examples may be performed.

For example, the electronic apparatus 500 is a network-related apparatus such as a base station or a router, a high-accuracy measurement apparatus that measures physical quantities such as a distance, a time, a flow velocity, and a flow rate, a biological information measurement apparatus that measure biological information, or an in-vehicle apparatus. For example, the biological information measurement apparatus is an ultrasonic measurement device, a sphygmograph, or a blood pressure measurement device. The in-vehicle apparatus is an apparatus for automatic driving. The electronic apparatus 500 may be a wearable apparatus such as a head-mounted display device or a timepiece-related apparatus, a robot, a printing device, a projection device, a portable information terminal such as a smartphone, a content providing apparatus that distributes contents, or a video apparatus such as a digital camera or a video camera.

The communication interface 510 receives data from the outside through the antenna ANT, or performs processing for transmitting data to the outside. The processing device 520 which is the processor performs control processing of the electronic apparatus 500 and various digital processing of data transmitted and received through the communication interface 510. For example, the functions of the processing device 520 may be realized by a processor such as a microcomputer. The operation interface 530 is used by a user who performs an input operation, and may be realized by an operation button or a touch panel display. The display unit 540 displays various information, and may be realized by a liquid crystal or organic EL display. The memory 550 stores data, and the functions thereof may be realized by a semiconductor memory such as RAM or ROM.

Figure 13:
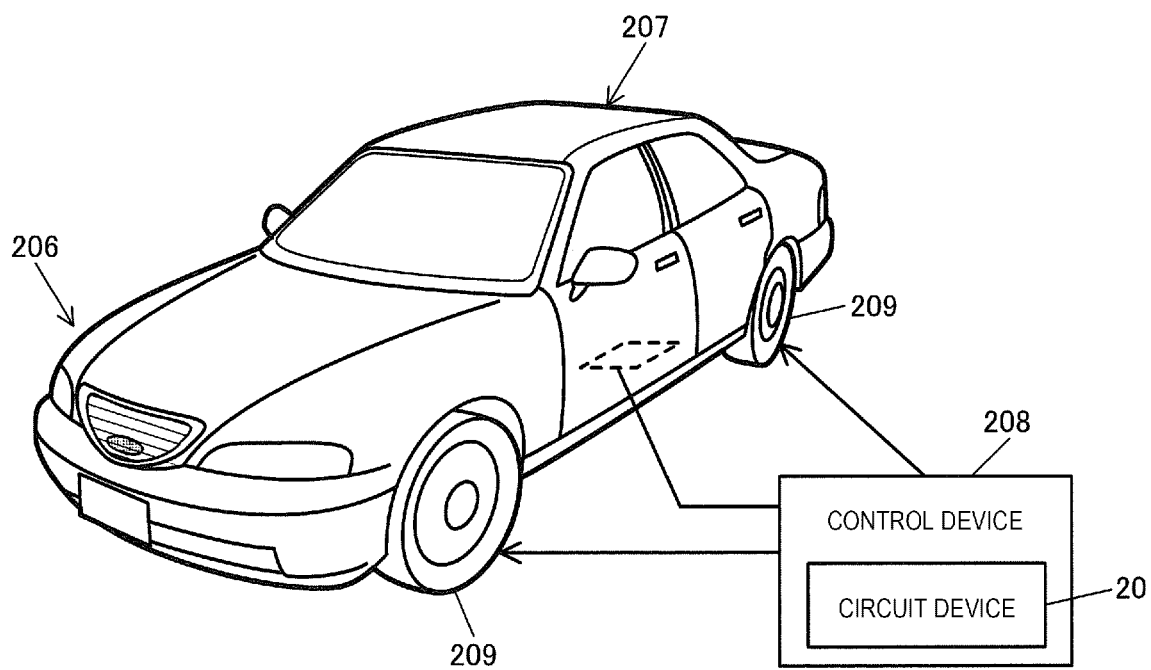
FIG. 13 is a configuration example of a vehicle.

FIG. 13 shows an example of the vehicle including the circuit device 20 of the present embodiment. For example, the circuit device 20 of the present embodiment may be incorporated into various vehicles such as a car, an airplane, a motorcycle, a bicycle, and a ship. For example, the vehicle is an apparatus or a device that includes a drive mechanism such as an engine or a motor, a steering mechanism such as a steering wheel or a rudder, and various electronic apparatuses, and moves on the ground, in the sky, or in the sea. FIG. 13 schematically shows a car 206 as a specific example of the vehicle. The oscillator (not shown) including the circuit device 20 of the present embodiment is incorporated into the car 206. A control device 208 is operated by a clock signal generated by the oscillator. For example, the control device 208 controls the hardness of a suspension according to a posture of a car body 207 or controls brakes of individual car wheels 209. For example, the automatic driving of the car 206 may be realized by the control device 208. The apparatus into which the circuit device 20 of the present embodiment is incorporated is not limited to the control device 208, and may be incorporated into various in-vehicle apparatuses such as a meter panel apparatus or a navigation apparatus provided at the vehicle such as the car 206.

As described above, a circuit device of the present embodiment includes a first output signal line, a second output signal line, and an oscillation circuit that generates differential oscillation signals which are constituted by a first signal and a second signal, outputs the first signal to the first output signal line, and outputs the second signal to the second output signal line. The circuit device of the present embodiment includes a monitor circuit that includes a first input unit including a first input capacitor of which a one end is coupled to the first output signal line and an output unit which is coupled to the first input unit and outputs a monitor result, and a capacitance compensation circuit that includes a second input unit including a second input capacitor of which a one end is coupled to the second output signal line.

According to the present embodiment, the oscillation circuit generates the first and second signals constituting the differential oscillation signals, and outputs the generated signals to the first and second output signal lines. As stated above, the differential signal transmission of the oscillation signal of the oscillation circuit is performed, and thus, it is possible to realize signal transmission with high noise resistance and with high stability at high speed. In the present embodiment, the monitor circuit is provided for the first output signal line, and the capacitance compensation circuit is provided for the second output signal line. The monitor circuit includes the first input unit and the output unit coupled to the first input unit, a one end of the first input capacitor of the first input unit is coupled to the first output signal line, and the output unit outputs the monitor result. Meanwhile, the capacitance compensation circuit includes the second input unit, and a one end of the second input capacitor of the second input unit is coupled to the second output signal line. As stated above, the monitor circuit is provided for the first output signal line, and thus, it is possible to monitor the signal state of the first signal. Accordingly, it is possible to realize the appropriate operation of the oscillation circuit. The capacitance compensation circuit including the second capacitor corresponding to the first input capacitor of the monitor circuit is provided for the second output signal line. Such a capacitance compensation circuit is provided, and thus, it is possible to compensate for the influence of the capacitance added to the first output signal line by coupling the monitor circuit by using the second input capacitor of the capacitance compensation circuit. Accordingly, it is possible to prevent the balance between the differential oscillation signals from deteriorating. Accordingly, it is possible to provide the circuit device capable of monitoring the signal states of the differential oscillation signals while preventing the balance between the differential oscillation signals from deteriorating.

In the present embodiment, the first input unit may include a first voltage setting circuit that sets a voltage of the other-side end of the first input capacitor, and the second input unit may include a second voltage setting circuit that sets a voltage of the other-side end of the second input capacitor.

By providing the first voltage setting circuit as stated above, a one end of the first input capacitor is coupled to the first output signal line, whereas the other-side end of the first input capacitor is set to the predetermined voltage. By providing the second voltage setting circuit, a one end of the second input capacitor is coupled to the second output signal line, and the other-side end of the second input capacitor is set to the predetermined voltage.

In the present embodiment, the output unit may include a buffer circuit that outputs, as the monitor result, a signal obtained by buffering an input signal from the first input unit.

In this manner, the signal corresponding to the first signal of the first output signal line can be input as the input signal from the first input unit to the buffer circuit, and the signal obtained by buffering the input signal can be output as the monitor result from the output unit.

In the present embodiment, the output unit may include a detection circuit that outputs, as the monitor result, a detection result for an input signal from the first input unit.

In this manner, the signal corresponding to the first signal of the first output signal line can be input as the input signal from the first input unit to the detection circuit, and the detection result of the detection circuit can be output as the monitor result from the output unit.

In the present embodiment, the circuit device may further include a terminal that outputs the monitor result of the monitor circuit.

In this manner, it is possible to output the monitor result of the monitor circuit through the terminal to the external device, and it is possible to realize the detection or analysis of the signal state of the first signal.

In the present embodiment, the oscillation circuit may be an LC oscillation circuit including an inductor and a capacitor.

In this manner, it is possible to output the first and second output signal lines by generating the first and second signals constituting the differential oscillation signals with a simple circuit configuration using the LC oscillation circuit.

In the present embodiment, the monitor circuit may be disposed at a side of a first direction of a reference line between the first output signal line and the second output signal line, and when an opposite direction of the first direction is a second direction, the capacitance compensation circuit may be disposed at a side of the second direction of the reference line.

In this manner, it is possible to arrange the monitor circuit at the side of the first direction and it is possible to arrange the capacitance compensation circuit at the side of the second direction by using the reference line corresponding to the first and second output signal lines as the reference. It is possible to improve the symmetry of the layout arrangement, and it is possible to prevent the balance of the differential signal transmission from deteriorating.

In the present embodiment, the oscillation circuit may be an LC oscillation circuit including an inductor and a capacitor, and when a direction perpendicular to the first direction is a third direction, the inductor may be disposed at a side of the third direction of the monitor circuit and the capacitance compensation circuit.

In this manner, it is possible to achieve the layout arrangement of the inductors for realizing the LC oscillation circuit by effectively using the region at the side of the third direction of the monitor circuit and the capacitance compensation circuit, and it is possible to improve the layout efficiency.

In the present embodiment, the oscillation circuit may include a first capacitor of which a one end is coupled to the first output signal line and a capacitance is variable, and a second capacitor of which a one end is coupled to the second output signal line and a capacitance is variable. The first capacitor may be disposed at the side of the first direction with respect to the reference line, and the second capacitor may be disposed at the side of the second direction with respect to the reference line.

In this manner, it is possible to control or adjust the oscillation frequency of the oscillation circuit by providing the first and second capacitors of which the capacitances are variable. It is possible to couple the first and second capacitors to the first and second output signal lines with a short path, and it is possible to improve the layout efficiency.

In the present embodiment, the circuit device may further include a comparison circuit that compares a reference clock signal with a clock signal based on the first signal and the second signal, a charge pump circuit that performs a charge pump operation based on a comparison result of the comparison circuit, and a low-pass filter that performs smoothing of an output signal of the charge pump circuit, generates a control voltage for controlling an oscillation frequency of the oscillation circuit, and outputs the generated control voltage to the oscillation circuit.

In this manner, the oscillation circuit that generates the differential oscillation signals can be used as a voltage control oscillator of the PLL circuit. The signal state of the first signal of the oscillation circuit is monitored by the monitor circuit, and thus, it is possible to realize the appropriate operation of the PLL circuit.

The present embodiment relates to the oscillator including the circuit device and the resonator electrically coupled to the circuit device.

The present embodiment relates to the electronic apparatus including the aforementioned circuit device.

The present embodiment relates to the vehicle including the aforementioned circuit device.

While the present embodiment has been described in detail, it will be easily understood by those skilled in the art that many modifications are possible without substantially departing from the novelty and effects of the present disclosure. Therefore, all the modifications may be included in the scope of the present disclosure. For example, in the specification or drawings, the terms described together with broader or synonymous different terms at least once may be replaced with different terms in any of the specification or drawings. All combinations of the present embodiment and the modification example are also included in the present embodiment. The configurations and operations of the circuit device, the oscillator, the electronic apparatus, and the vehicle or the circuit configuration and arrangement configuration of the output drivers are also not limited to those described in the present embodiment, and may be variously modified.

What is claimed is:

1. A circuit device comprising:
    a first output signal line;
    a second output signal line;
    an oscillation circuit that generates differential oscillation signals which are constituted by a first signal and a second signal, outputs the first signal to the first output signal line, and outputs the second signal to the second output signal line;
    a monitor circuit that includes a first input unit including a first input capacitor of which a one end is coupled to the first output signal line and an output unit which is coupled to the first input unit and outputs a monitor result; and
    a capacitance compensation circuit that includes a second input unit including a second input capacitor of which a one end is coupled to the second output signal line,
    wherein the output unit includes a buffer circuit that outputs, as the monitor result, a signal obtained by buffering an input signal from the first input unit, the buffer circuit including an operational amplifier coupled to an other end of the first input capacitor but not coupled to an other end of the second input capacitor, wherein:
    the monitor circuit is disposed at a side of a first direction of a reference line between the first output signal line and the second output signal line,
    when an opposite direction of the first direction is a second direction, the capacitance compensation circuit is disposed at a side of the second direction of the reference line,
    the oscillation circuit includes a first capacitor of which a one end is coupled to the first output signal line and a capacitance is variable, and a second capacitor of which a one end is coupled to the second output signal line and a capacitance is variable, the first capacitor is disposed at the side of the first direction with respect to the reference line, and the second capacitor is disposed at the side of the second direction with respect to the reference line.

2. The circuit device according to claim 1, wherein the first input unit includes a first voltage setting circuit that sets a voltage of the other end of the first input capacitor, and the second input unit includes a second voltage setting circuit that sets a voltage of the other end of the second input capacitor.

3. The circuit device according to claim 1, wherein the output unit includes a detection circuit that outputs, as the monitor result, a detection result for an input signal from the first input unit.

4. The circuit device according to claim 1, further comprising:

a terminal that outputs the monitor result of the monitor circuit.

5. The circuit device according to claim 1, wherein the oscillation circuit is an LC oscillation circuit including an inductor and a capacitor.

6. The circuit device according to claim 1, further comprising:

a comparison circuit that compares a reference clock signal with a clock signal based on the first signal and the second signal;

a charge pump circuit that performs a charge pump operation based on a comparison result of the comparison circuit; and a low-pass filter that performs smoothing of an output signal of the charge pump circuit, generates a control voltage for controlling an oscillation frequency of the oscillation circuit, and outputs the generated control voltage to the oscillation circuit.

7. An oscillator comprising:

the circuit device according to claim 1; and a resonator that is electrically coupled to the circuit device.

8. An electronic apparatus comprising the circuit device according to claim 1.

9. A vehicle comprising the circuit device according to claim 1.

10. A circuit device comprising:

a first output signal line;

a second output signal line;

an oscillation circuit that generates differential oscillation signals which are constituted by a first signal and a second signal, outputs the first signal to the first output signal line, and outputs the second signal to the second output signal line;

a monitor circuit that includes a first input unit including a first input capacitor of which a one end is coupled to the first output signal line and an output unit which is coupled to the first input unit and outputs a monitor result; and a capacitance compensation circuit that includes a second input unit including a second input capacitor of which a one end is coupled to the second output signal line, wherein the output unit includes a buffer circuit that outputs, as the monitor result, a signal obtained by buffering an input signal from the first input unit, the buffer circuit including an operational amplifier coupled to an other end of the first input capacitor but not coupled to an other end of the second input capacitor, wherein:

the monitor circuit is disposed at a side of a first direction of a reference line between the first output signal line and the second output signal line, when an opposite direction of the first direction is a second direction, the capacitance compensation circuit is disposed at a side of the second direction of the reference line, the oscillation circuit is an LC oscillation circuit including an inductor and a capacitor, and when a direction perpendicular to the first direction is a third direction, the inductor is disposed at a side of the third direction of the monitor circuit and the capacitance compensation circuit.

* * * * *